United States Patent [19]

Kawahara et al.

[11] Patent Number: 5,426,060
[45] Date of Patent: Jun. 20, 1995

[54] METHOD OF INSPECTING IMAGE SENSORS

[75] Inventors: Yukito Kawahara; Satoshi Machida; Hiroshi Mukainakano; Masahiro Yokomichi; Masato Higashi, all of Tokyo, Japan

[73] Assignee: Seiko Instruments Inc., Japan

[21] Appl. No.: 939,090

[22] Filed: Sep. 2, 1992

Related U.S. Application Data

[62] Division of Ser. No. 775,824, Oct. 11, 1991.

[30] Foreign Application Priority Data

Oct. 12, 1990 [JP] Japan .................................. 2-273527
Nov. 26, 1990 [JP] Japan .................................. 2-321839

[51] Int. Cl.⁶ .......................................... H01L 21/66
[52] U.S. Cl. ...................................... 437/8; 437/226; 437/227
[58] Field of Search ............................ 437/8, 226, 227

[56] References Cited

U.S. PATENT DOCUMENTS 3,795,045 3/1974 Dumas .................................. 437/8
4,182,024 1/1980 Cometta .............................. 437/8
5,047,364 9/1990 Hattori ................................ 437/226
5,059,899 10/1991 Farnworth et al. ................... 437/8
5,179,035 1/1993 Shannon .............................. 437/226

Primary Examiner—Brian E. Hearn
Assistant Examiner—Linda J. Fleck
Attorney, Agent, or Firm—Bruce L. Adams; Van C. Wilks

[57] ABSTRACT

A method of inspecting and a method of manufacturing image sensors formed on a surface of a semiconductor wafer. A semiconductor wafer is provided having image sensors formed on its surface. Grooves are cut at boundaries between image sensors to be inspected, so that each groove has a depth that is smaller than the thickness of the semiconductor wafer. The grooves are cut in the boundaries between the image sensors so that photoN sensing carriers generated in the boundary regions, that are not generated by the image sensor being inspected, do not affect the inspection of the image sensor. The characteristics of the image sensors are inspected before cutting through the semiconductor wafer to form individual image sensors. Thus, in accordance with the present invention, the electrical characteristics of the image sensors can be accurately ascertained either before or after separation from the semiconductor wafer.

12 Claims, 9 Drawing Sheets

METHOD OF INSPECTING IMAGE SENSORS

This is a division, of application Ser. No. 775,824 filed Oct. 11, 1991.

BACKGROUND OF THE INVENTION (1) Field of the Invention

This invention relates to linear image sensors used to read pictures in such devices as facsimiles, image scanners, digital copiers, etc. More particularly, the invention concerns photo response uniformity among individual photo sensing elements.

(2) Description of the Related Art

Figure 2A:
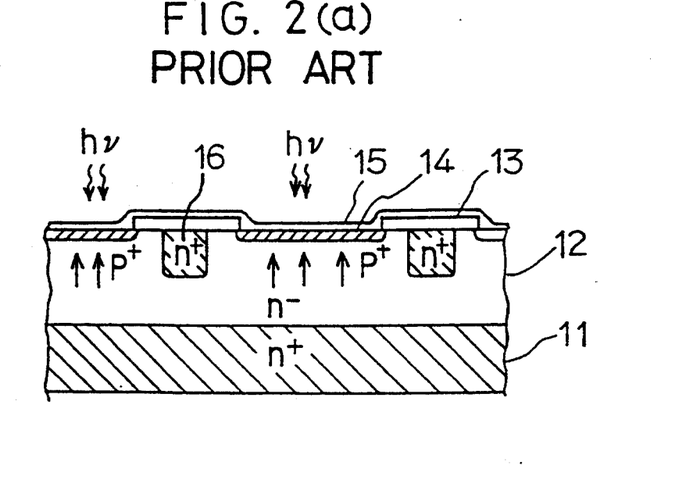
FIG. 2(a) is a sectional view of the conventional linear image sensor.
Figure 2B:
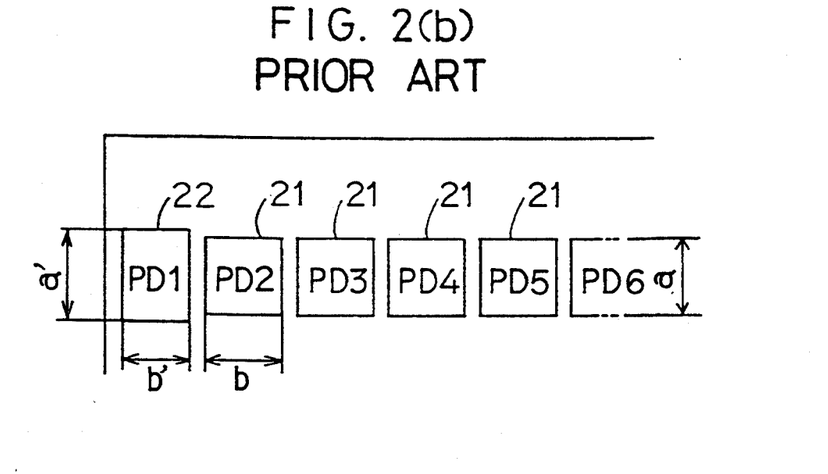
FIGS. 2(b) and (c) are plans of end portions of the conventional linear image sensor.
Figure 2C:
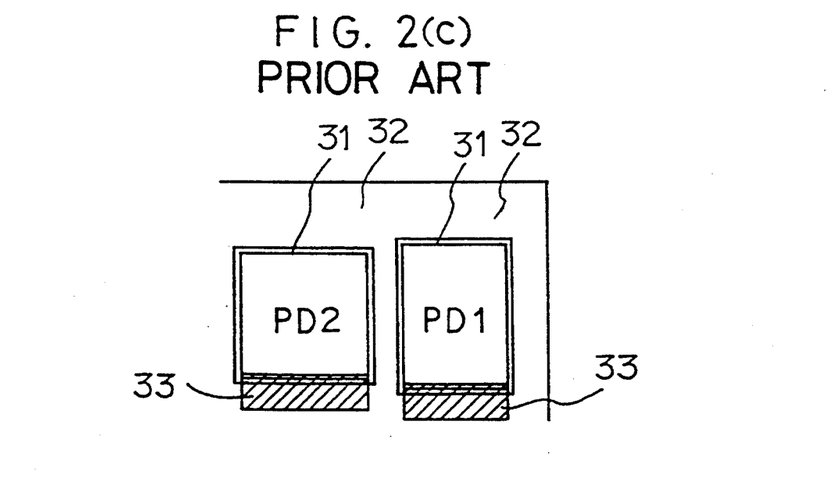

Conventional linear image sensors, as shown in FIGS. 2(a)-(c), usually consist of a plurality of diffusion layers to store photo excited carriers by equal-area conversion. FIG. 2(a) shows the linear image sensors. In an $n^-$ type semiconductor substrate 12, p type high impurity concentration diffusion layers 14 are formed to form photo-diode light receiving elements. The region 11 is an $n^+$ type semiconductor substrate. Inter-insulating film 13 consists of $SiO_2$ for deactivating the surface of the substrate. Photo sensing elements 21 are all of the same size. Photo sensing elements 22 are end positioned elements and are of a different size than the other elements 21; however, the areas of the end positioned elements 22 as well as the other elements 21 are equal. As shown in FIG. 2(b), $a \times b = a' \times b'$. A portion 32 is between an element isolation layer 16 and a diffusion layer 31. A portion 33 indicates an electrode lead.

Such conventional linear image sensors discussed above are disclosed in Publication No. 57-157680.

In conventional linear image sensors, between the impurity diffusion layers 21 (which become normal photo sensing elements which store photo excited carriers) and the impurity diffusion layers 22 (which store photo excited carriers by equal-area conversion), regionally generated photo sensing carriers are the same in capacity, but different in shape. This means that the distance the carriers stored in the layer 22 must travel becomes greater than that for those stored in the layer 21. Thus, the field intensity of the layers 21 and 22 in the direction of the electrode lead 33 becomes different, and therefore, it takes longer to remove or to read the carriers out from the layer 22. This difference in reading time in conventional linear image sensors has caused a problem. Photo sensing elements consisting of photo diodes somewhat help to reduce the difference in reading time; however, in photo sensing elements consisting of photo-transistors having differences in shape as shown in FIG. 2(b), i.e., wherein the width of b' is shorter than that of b, even though the areas of the two layers are equal, a problem exists wherein the amplification factor Hfe of the layer 22 becomes higher than that of the layer 21. As a result, the amount of signal electric charge of the layer 22 becomes larger than that of the layer 21, thereby resulting in problems of reducing photo response uniformity among the linear image sensor elements.

For uniform resolution and improved quality of images, all photo sensing elements would preferably be made equal in size and would be arranged keeping the distance between each of the elements equal.

According to the present invention, and in order to solve the above-mentioned problems, objectives of the invention are to improve photo response uniformity in linear image sensors by means of making all photo sensing areas equal in area by equal-area conversion. In addition, the shape of all impurity diffusion layers used to store generated photo excited carriers are made equal.

The present invention has an untransmittable (or non-light transmittable) shading film having photo-sensing windows or opening holes to allow photo sensing elements to receive light, while other areas are shaded from receiving light. The area of each of the opening holes is made to be equal. All diffusion layers for storing generated photo excited carriers are also made to be equal in both shape and area. Thereby, the present invention improves photo response uniformity.

Figure 7:
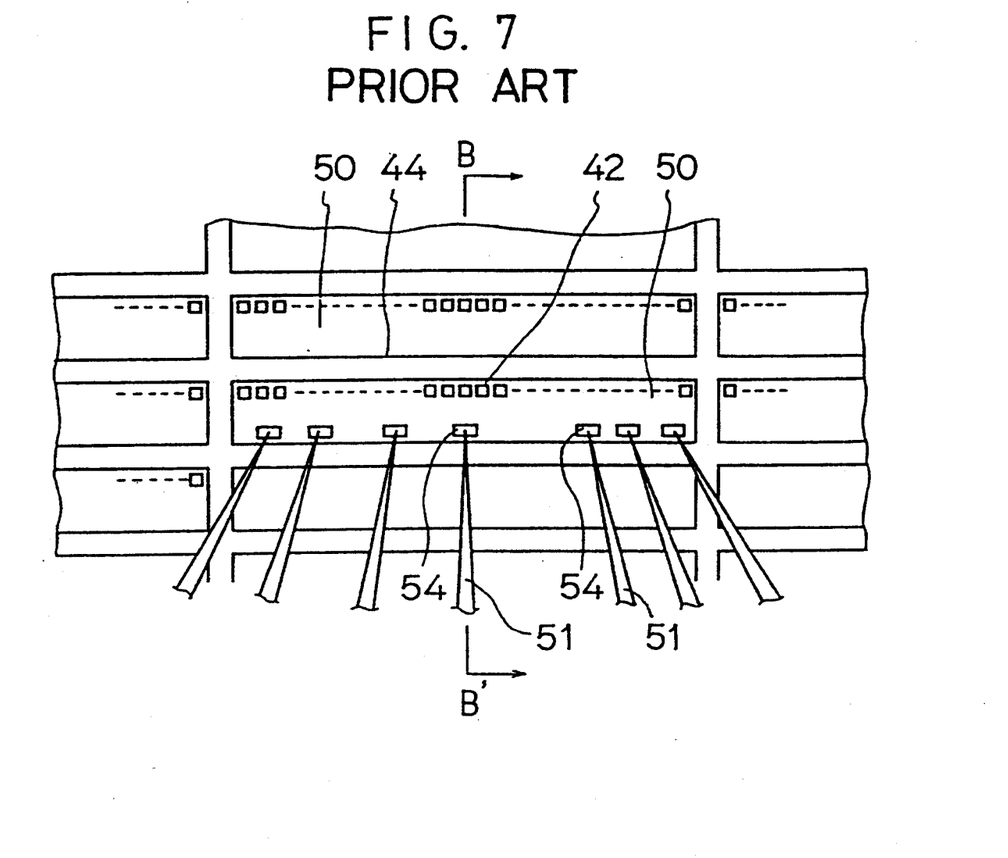
FIG. 7 is a plan view at the time of inspecting in the conventional method.

A plurality of linear image sensors is formed at the same time in the surface of a semiconductor substrate using a conventional fabrication technique to produce solid state imaging devices, as shown in FIG. 7. With regard to individual image sensors prior to isolation of each one of the plurality of sensors formed at the same time, since there are no grooves at the boundaries of each individual linear image sensor 50, the photo-electro conversion characteristics are inspected by irradiation to the surface of the semiconductor wafer.

Figure 8:
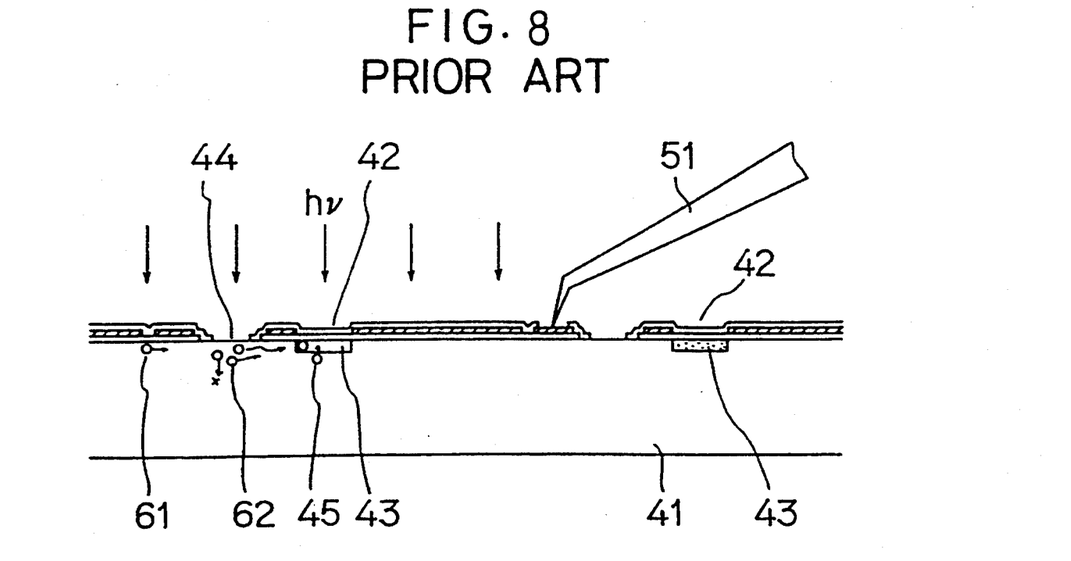
FIG. 8 is a sectional view of FIG. 7 taken in the direction of the arrows substantially along the line B—B'.

In the conventional method of inspecting linear image sensors, as shown in FIG. 8, which is a sectional view taken in the direction of the arrows substantially along the line B—B' of FIG. 7, each portion representing boundaries 44 between each of a plurality of linear image sensors 50 is irradiated by light. Photo sensing carriers 62 generated in the boundary region of a semiconductor wafer are entered into a diffusion layer 43 which forms the photo sensing element of the linear image sensor being inspected. This results in an increase of photo electro conversion efficiency. In the worse case, since linear image sensors adjacent to the one being inspected are also irradiated by light, more photo sensing carriers 61 are generated and enter into the diffusion layer 43 which forms the photo sensing element of the linear image sensor 50 being inspected. The result is akin to an increase of photo-electro conversion efficiency. However, the inspected linear image sensors are used in the form of multi-chip and contact type linear image sensors consisting of a plurality of linear image sensors, and in the final stage each individual linear image sensor is completely cut off and is used separately. Thereby, under the condition that each individual is completely separated, photo-electro conversion characteristics of photo sensing carriers 45 generated in each linear image sensor by irradiation of light through a photo sensing window 42 reflects photo-electro conversion efficiency of contact type linear image sensors. Therefore, in the conventional method of inspection, conversion efficiency results were largely different before and after cutting off each individual image sensor from the wafer. In the worst case, the conversion efficiency of individually formed and separated contact type linear image sensors was shown to be about 20 to 60 percent lower compared to that of the image sensors while still on the semiconductor wafer.

According to the present invention, in order to solve the above-mentioned problems, an objective is to obtain consistent photo-electro conversion efficiency at the time of inspecting linear image sensors formed on the semiconductor wafer.

SUMMARY OF THE INVENTION

It is an object of the present invention to provide an image sensor comprising a semiconductor substrate having a first conductivity type; at least one photo-sensing element arrayed linearly in a surface of the semiconductor substrate comprising an impurity diffusion layer having an opposite conductivity type to the first conductivity type, and a transparent insulating film formed on a surface of the semiconductor substrate; and a layer formed on the photo-sensing element for shading light from the photo-sensing elements, having photo-sensing windows partially overlaying each of the photo-sensing elements, to determine a photo-sensing region of a plurality of the photo-sensing elements.

A further object of the invention is to provide an image sensor head comprising a base plate; a semiconductor substrate of a first conductivity type having a plurality of image sensors mounted on the base plate linearly with one another in a main scanning direction of the image sensor; a plurality of photo-sensing elements arrayed linearly in a surface of the semiconductor substrate comprising an impurity diffusion layer having an opposite conductivity type from the first conductivity type, and a transparent insulating film formed on the photo-sensing elements and the surface of the semiconductor substrate; and an untransmittable layer formed on the transparent insulating film for shading light from the photo-sensing elements, having photo-sensing windows overlaying a part of each of the photo-sensitive elements, to determine a photo-sensing region of a plurality of the photo-sensing elements.

In order to solve the above-mentioned problems, the present invention has a structure wherein semiconductors are covered with an untransmittable metallic thin shading film. The untransmittable metallic thin film has opening holes, which form photo sensing portions of the photo sensing elements. The exposed photo sensing portions of the elements are not always equal in shape, but are equal in area by equal-area conversion. Also, each one of the impurity diffusion layers (photo-sensing elements) are equal in shape as well as in area, and store photo excited carriers generated inside semiconductors, due to irradiation of the semiconductors. In addition, the insulating capacity stored between untransmittable metallic thin film regions and impurity diffusion layers are equal in each photo sensing element. The above-described structure enhances photo response uniformity.

In the case where the linear image sensors are structured as described above, and irradiated with uniform light, the capacity of photo excited carriers among each of the photo sensing elements is approximately equal, since each of the photo sensing elements converted to an equal effective area is irradiated by the same amount of light through the opening holes, and each of the impurity diffusion layers are equal in shape. In addition, the insulation capacity formed between impurity diffusion layers and metallic films for shading, and therefore, the output impedance and the common-emitter current gain hfe among each of the photo sensing elements, while reading signal charge converted photo electrically toward the outside, are substantially uniform.

In view of the above noted drawbacks of the prior art, according to the present invention, a plurality of linear image sensors are formed at the same time on a semiconductor wafer surface, boundaries each of which are grooved 10 $\mu$m and more deep, and thereafter, photo-electro conversion characteristics of each of the linear image sensors is inspected after each of the individual linear image sensors are completely cut off separately. In this manner, characteristics of the linear image sensors can be obtained.

As described above, after cutting grooves at boundaries of each of the individual linear image sensors, photo-electro conversion characteristics are measured, and even though linear image sensors adjacent to the one being inspected are irradiated by light, since the inspection light is visible, light is absorbed by the semiconductor wafer within about 10 $\mu$m, and photo sensing elements generated at the boundaries are caught in grooves. Then, most of them within the boundaries and lower region recombine, so that few of them enter into the photo sensing elements to be inspected. Thus, at the time of inspecting each individual photo sensing element, whether on a semiconductor wafer or after having completely separated each individual photo sensing element, photo electro conversion characteristics can be inspected and accurate results provided.

DETAILED DESCRIPTION OF THE PREFERRED EMBODIMENTS

Figure 1A:
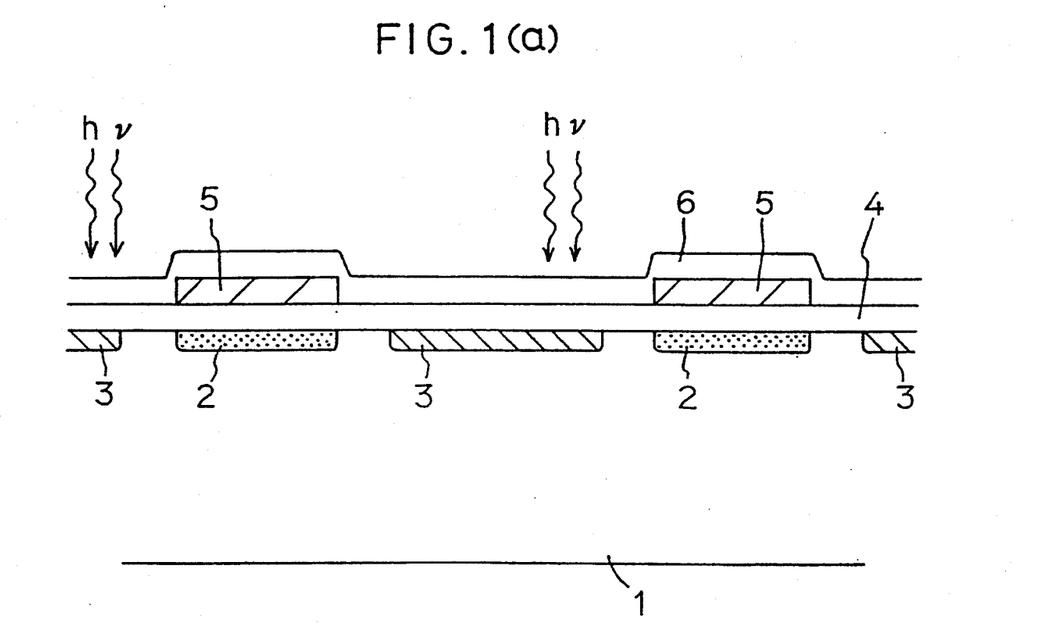
FIGS. 1(a) and (b) are sectional views of standard photo sensing elements comprising the linear image sensors of the present invention, taken along lines X1-X2 and Y1-Y2 of FIG. 1(c), respectively.
Figure 1B:
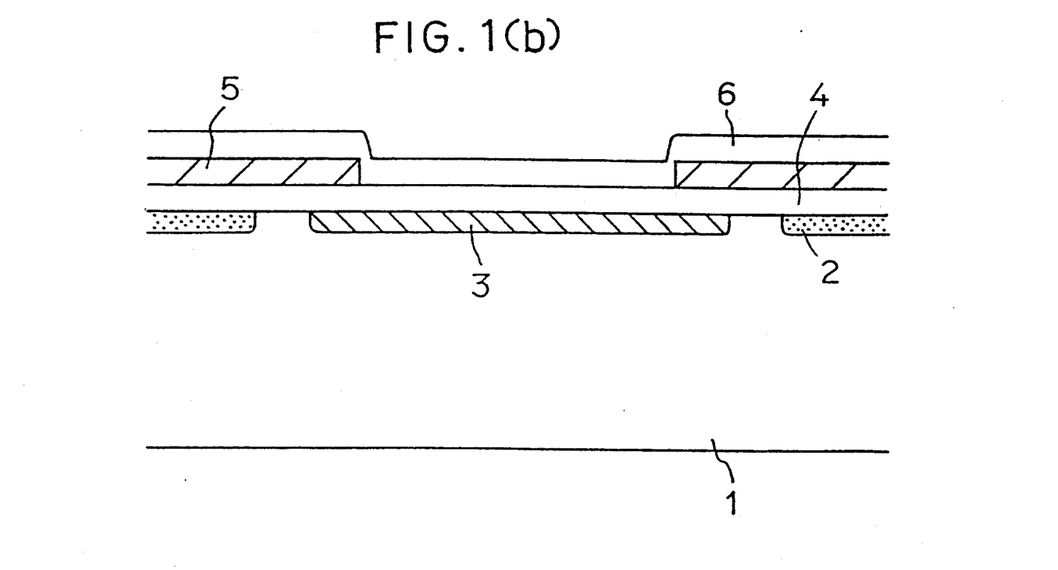

Referring now to FIG. 1(a), the manner in which a plurality of photo sensing elements is arranged and formed linearly in the surface side of a semiconductor substrate 1 is shown. The semiconductor substrate 1 is an n conductivity type silicon semiconductor substrate. An impurity diffusion layer 3 which is formed in the surface of the semiconductor substrate 1 functions to store holes from photo excited carriers generated inside of the semiconductor substrate 1 by irradiation of light hv, and is formed of a p-type layer consisting of high density Boron B or Indium In. In order to isolate the impurity diffusion layers 3 respectively, a device isolate layer 2 separates the layers 3, and consists of Phosphorus P. An Arsenic As or Antimony Sb high density n-type layer is formed in the surface of the semiconductor substrate 1. The surface of the semiconductor is covered with an inter-insulating film 4 formed over the previously formed layers. The inter-insulating film 4 is transparent, usually consisting of silicon dioxide $SiO_2$, and is formed by thermal oxidation, chemical vapor deposition or the like. On top of the inter-insulating film 4, an untransmittable metallic thin film 5 is formed as a shading film and has photo-sensing windows or opening holes corresponding to each of the photo sensing elements to determine photo-sensing areas. Under the opening holes of the untransmittable metallic thin film 5 are the photo sensing areas of the photo sensing elements 3. Usually, the untransmittable metallic thin film consists of aluminum, is deposited by spattering or vacuum evaporation, and then is formed by etching and patterning. Moreover, the top of the untransmittable metallic film 5 is covered with a passivation film 6. The passivation film consists of transparent phosphorus silicate glass PSG or silicon nitride $Si_3N_4$, and functions to prevent impurities such as ions, moisture, etc., from entering into the surface of the semiconductor substrate 1.

Figure 1C:
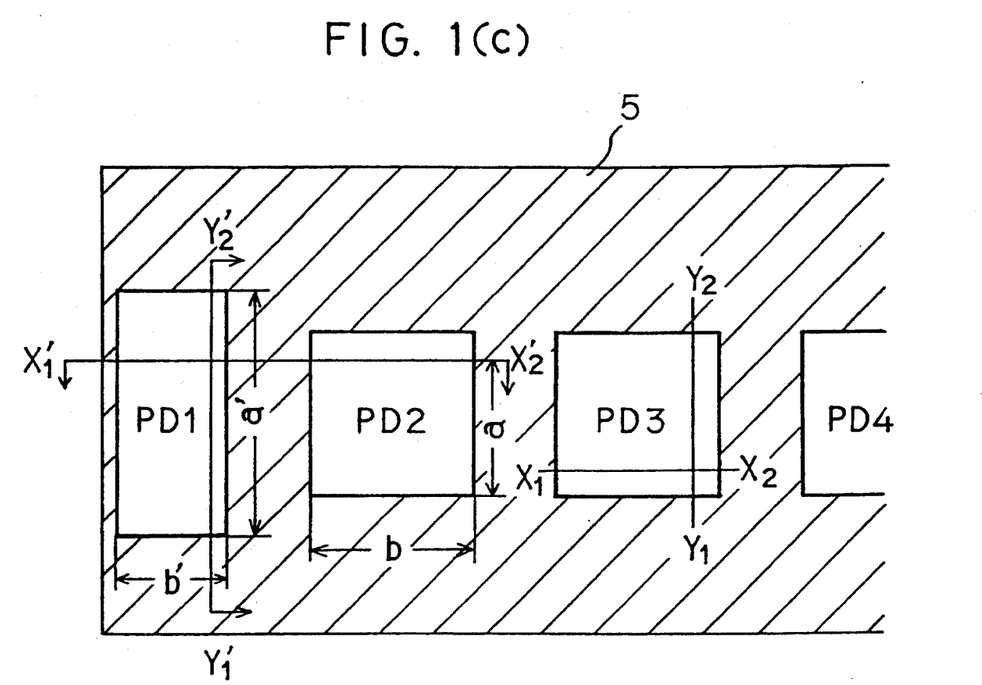
FIG. 1(c) is a plan view of an end portion of photo-sensing windows of the untransmittable metallic thin film according to the present invention.

Photo sensing elements having a structure as described so far are arranged linearly, and become detecting portions of the linear image sensor, an end portion of which is indicated in FIG. 1(c). In FIG. 1(c), PD1, PD2, etc. represent portions of the photo sensing elements 3, and the untransmittable metallic thin film 5, which is positioned above the photo sensing elements 3, is shown to show the difference in shape between the end opening holes (region PD1) and other opening holes (regions PD2, PD3, etc.). The shape of photo sensing elements beneath regions PD2, PD3, etc. is uniform, and each area SPD of these regions is equal to $SPD = a \times b$. The effective width of end positioned photo sensing elements in an array direction (that is, the direction from the first photo sensing element to the last) is shortened while the length (in the direction normal to the width) is increased; and the area of the opening area SPD of photo sensing element PD1 equals $SPD_1 = a' \times b'$, which satisfies $SPD_1 = SPD$ by equal area conversion. As a result, the area forming an overlaying intersection between the photo sensing element 3 and the opening hole of the untransmittable film 5 is equal for all photo sensing elements 3.

FIGS. 1(a) and (b) are plan views taken along lines $X_1-X_2$ and line $Y_1-Y_2$, respectively, in FIG. 1(c). As illustrated in FIGS. 1(a) and (b), in photo sensing elements, normally, between the impurity diffusion layer 3 and the untransmittable metallic thin layer 5 through the inter-insulating film 4, overlapping portions are generated, and the overlapping portions are indicated and correspond to $SOR_1$ and $SOR_2$ in FIG. 1(d). In the overlapping portions, insulation capacity COR results.

Figure 1D:
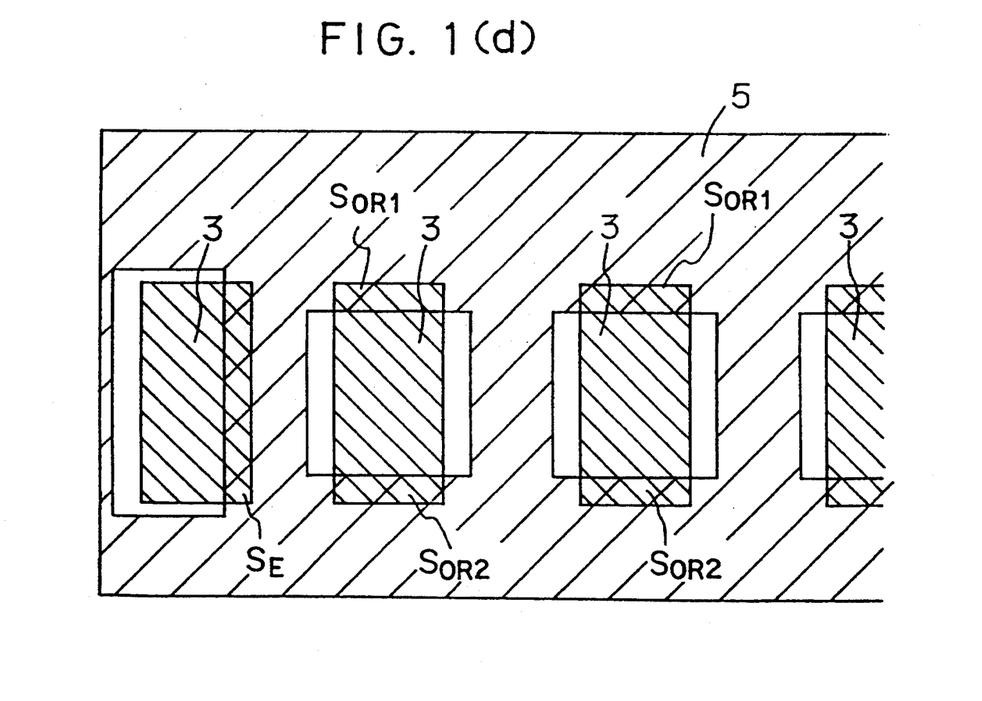
FIG. 1(d) is a plan view of an end portion of the photo-sensing windows overlaying the photo-sensing elements in accordance with the invention.
Figure 1E:
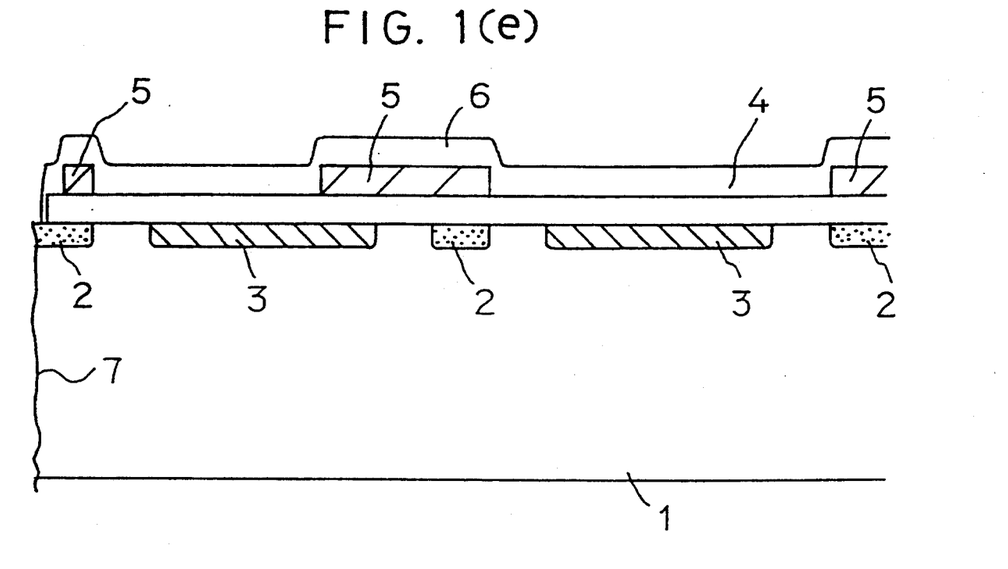
FIGS. 1(e) and (f) are sectional views of an end portion of an image sensor according to the present invention, taken in the direction of the arrows substantially along line X1'- X2' and Y1'- Y2' of FIG. 1(c), respectively.
Figure 1F:
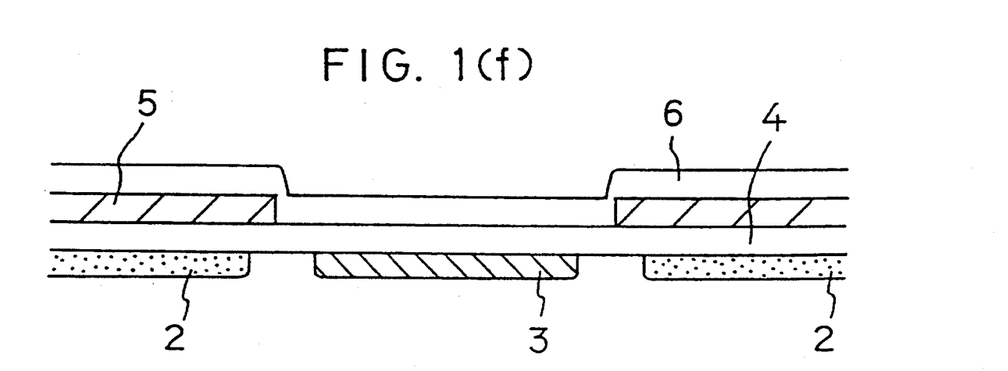

With regard to photo sensing elements positioned at the ends of the linear image sensor, as shown in FIGS. 1(e) and (f), a portion of the impurity diffusion layer 3 and the untransmittable metallic thin film 5 are overlapping through the inter-insulating film 4, and the area SE of the overlapping portion is equal to the above mentioned $SOR = SOR_1 + SOR_2$, i.e., $SE = SOR$. FIG. 1(d) shows a plan describing the overlapping portions. The overlapping portions are different in shape, but equal in area, and thereby the insulation capacity CE becomes equal to the above mentioned insulation capacity COR. Therefore, output impedance and common-emitter current gain hfe among end positioned photo sensing elements and other photo sensing elements while reading signals are approximately uniform, and in addition, reading time among them is about equal. As a result, photo response uniformity is enhanced. When photo sensing elements are comprised of photo-transistors, the common-emitter current gain hfe becomes uniform by making each shape of impurity diffusion layers equal, which realizes enhancement of photo response uniformity of photo-transistor type linear image sensors, and photo response characteristics which are more uniform than those comprising photo-diodes.

The present invention has a structure, as explained in the described embodiments, wherein each of the photo sensing areas corresponding to photo sensing elements is determined by the equally converted areas of opening holes on the untransmittable metallic thin film 5 which covers the surface of the semiconductor substrate. The shape of each of the impurity diffusion layers 3 which store generated photo excited carriers is equal, so that this simple structure enhances photo response uniformity of generated signals caused by irradiation of the same intensity of light. And in the case of manufacturing linear image sensors comprising a plurality of image sensors connected linearly to form one long linear image sensor, in the end portions of an array of photo sensing elements, crystals and insulation films are partially destroyed by a dicing process, and the width of the partially destroyed portion varies from a few μm to 30 μm. Therefore, it is impossible to have a few μm between each of the elements positioned at the end of each sensor when connecting a plurality of arrays of photo sensing elements. In order to keep the distance between the two openings at the end of each chip the same as every other distance, widths of the first and the last photo sensing areas responsive to the photo sensing elements need to be narrower than at the rest of the photo sensing areas, and are designed to be equal in area in order to keep sufficient photo response uniformity; however, without shading, as in the prior art, photo sensing areas only include impurity diffusion layers responsive to each of the photo sensing elements, in order to stabilize the P - N diffusion junction portion, and the portions at the end need to be positioned keeping enough distance from the scribed end portions to avoid interference between the elements. However, due to the limitation of the linear mounting precision positioning, it is hard to keep the proper distance between end positioned photo sensing areas on each chip, and the distance often can not be kept the same as the other areas.

Therefore, the end positioned elements often need to be formed of a different size from the rest of the elements. The width b' of the end positioned elements PD1 needs to be shortened to avoid the adverse effects of the scribed portion, and naturally the length a' needs to be longer because the area of $a' \times b'$ should be same as the areas $a \times b$ of the other elements. Therefore, the form or shape of the element PD1 turned out to be extremely different from the other elements, which resulted in poor quality of images of the end positioned element compared with the other elements. In sharp contrast, in the present invention, which includes shading wherein most regions of the opening holes become photo sensing areas, even if impurity diffusion layers which store photo excited carriers are formed very distant from the scribed portion, opening holes which determine photo sensing areas on an untransmittable metallic thin layer can be positioned close to the dicing portion, and due to the effect of the present invention, the distance between the end positioned photo sensing areas on each chip can be more easily kept the same as at other areas. Also, even if damage due to dicing affects the photo sensing portions of the semiconductor substrate for photo sensing elements positioned at the end, the connecting portion of the impurity diffusion layers are not affected by the damage, so that no trouble occurs wherein the same signals are generated between intervals of light and dark. Some generated photo excited carriers may be destroyed because of the damage, but those are very few, and this does not cause a reduction in photo response uniformity.

Hereinafter, the method of inspection of the linear image sensors which remain on a semiconductor wafer is described as follows.

Figure 3:
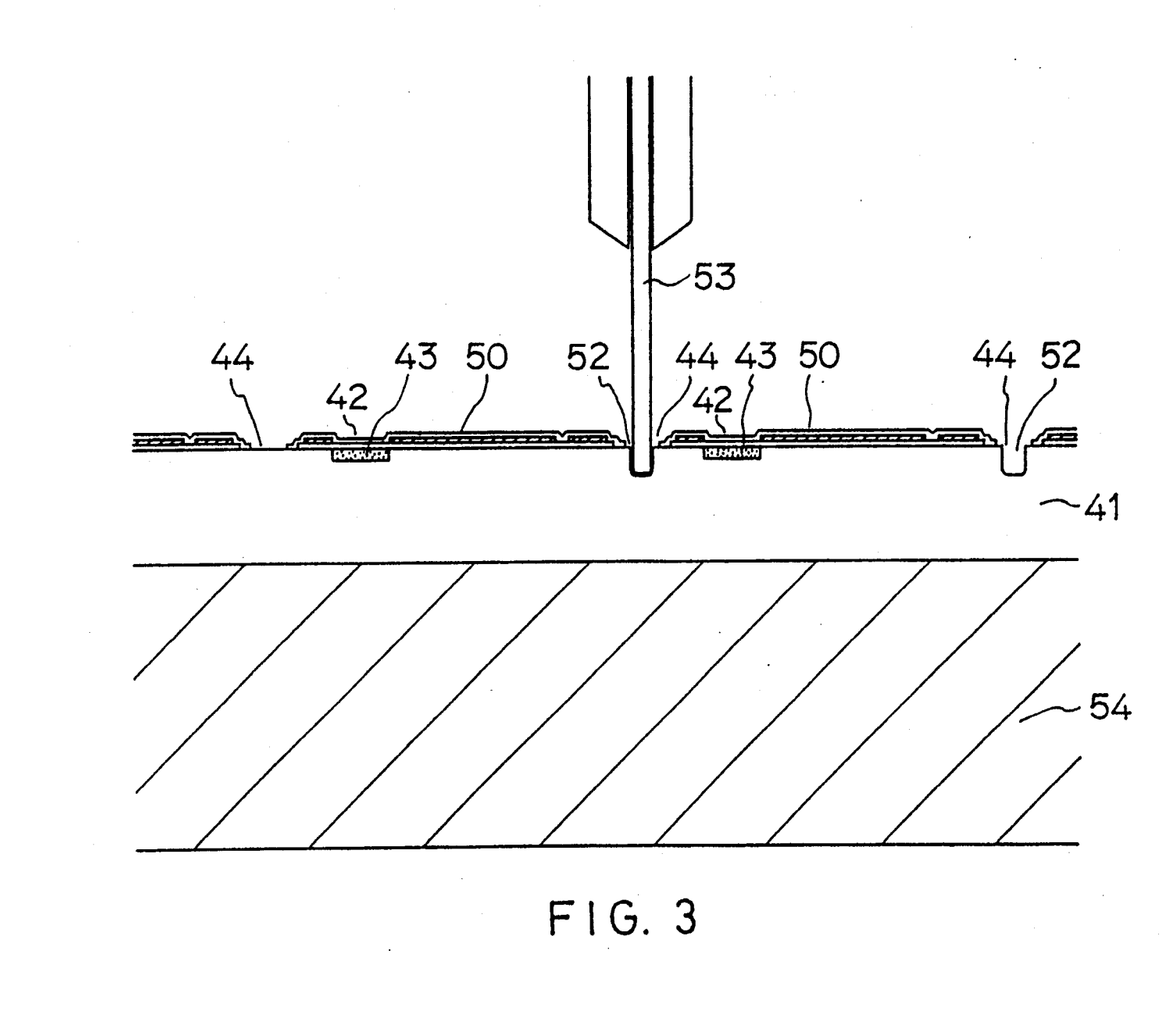
FIG. 3 is a sectional view at the time of cutting grooves on a wafer surface before inspection of linear image sensors according to the present invention, taken along line X-Y of FIG. 4.

With regard to FIG. 3, a semiconductor wafer 41 is placed and fixed with the linear image sensor 50 formed side up on a dicing saw stage. Then, on the boundaries 44 between a plurality of linear image sensors formed on the surface of the semiconductor wafer 41, grooves $\geq 10$ μm deep are cut while turning the dicing saw blade fast. The distance between the groove 52 and the linear image sensor 50 on the diffusion layer 43 is designed to be at least 5 μm, so as not to let carriers stored in the diffusion layer 43 forming the photo sensing element escape because of distortion on the surface of the semiconductor wafer 41.

Figure 4:
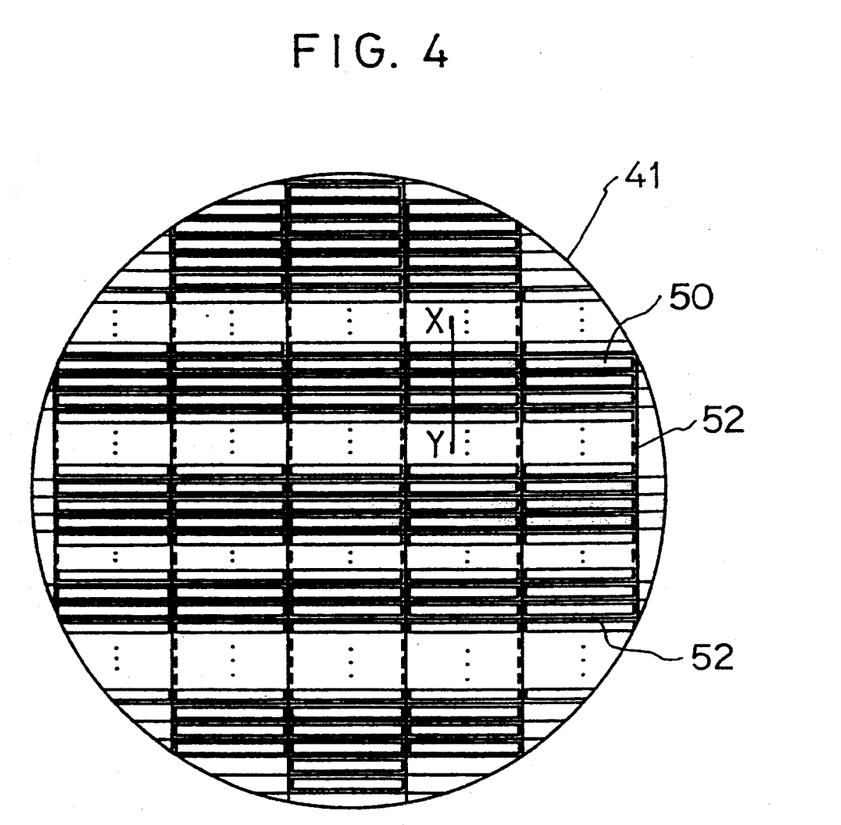
FIG. 4 is a plan view showing the semiconductor wafer after cutting grooves at boundaries of linear image sensors.
Figure 5:
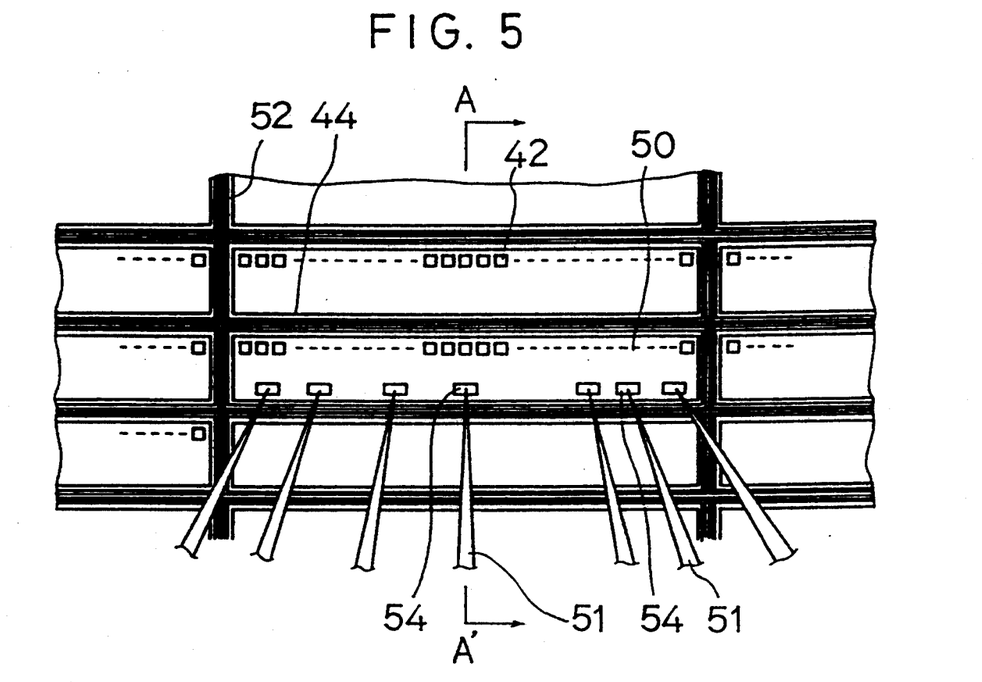
FIG. 5 is a plan view at the time of inspecting linear image sensors of the present invention.
Figure 6:
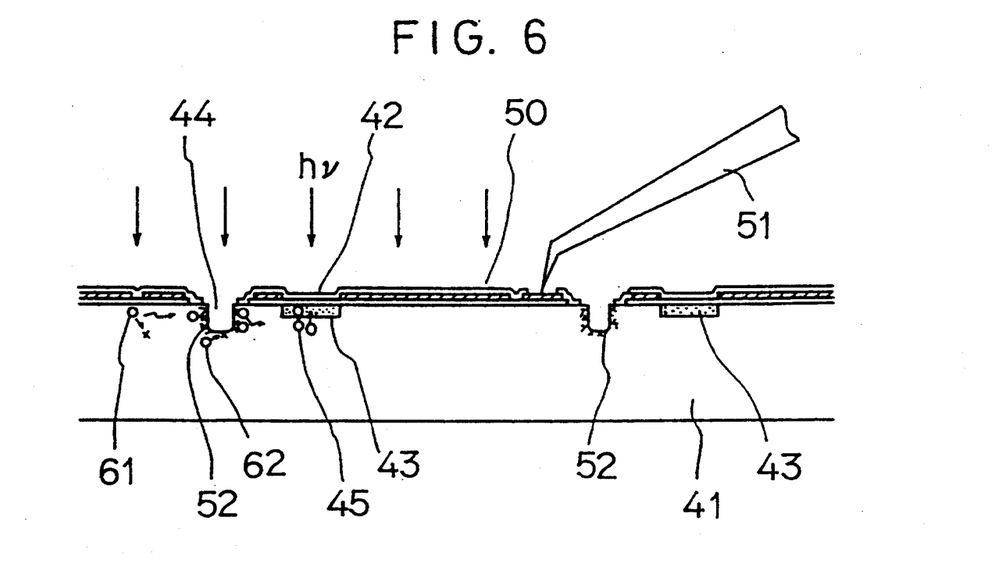
FIG. 6 is a sectional view taken in the direction of the arrows substantially along the line A—A' of FIG. 5.

In FIG. 4, grooves 52 are cut at each boundary between a plurality of linear image sensors 50 formed on a semiconductor wafer 41. With regard to each of the linear image sensors 50 on the wafer, using a solid state imaging device tester for inspection, as shown in FIG. 5, linear image sensors 50 are probed by inspection needles 51 to test whether they function normally. At the time of the inspection, not only are linear image sensors being inspected, but also adjacent areas are irradiated by light. Unlike the conventional sensors described in FIG. 8, as shown in FIG. 6, most of the photo sensing carriers 62 generated by irradiation in a boundary region 44 are caught or recombined in a region of deformed lattice or a distorted region because of the cutting grooves 52 and also around the linear image sensors 50 being inspected. Most of the generated photo sensing carriers 61 are diffused or recombined distant from the surface of and deep into the semiconductor wafer 41, or are diffused to grooves 52 and recombined. Thereby, most of the photo sensing carriers stored in the diffusion layer 43 forming a photo sensing element are photo sensing carriers 45 generated by irradiation of light hv through the photo sensing window 42.

In addition to groove cutting by the dicing saw, a scraper or a laser may be used for groove cutting. Alternatively a plasma-etcher may be used for groove cutting, as in the ordinary semiconductor fabrication process.

According to the present invention, at boundaries of a plurality of linear image sensors formed simultaneously on the semiconductor wafer, and after cutting grooves 10 μm or more deep, photo electric conversion characteristics can be inspected before separating each of the individual sensors from the semiconductor wafer.

Thus, as a result of this simple method, characteristics of each of the individual linear image sensors before as well as after the separation can be inspected.

In fabricating multi-chip and contact type image sensors comprising linear image sensors inspected according to the method of the present invention, capabilities such as sensitivity can be detected in advance, which enables the setting of constants of peripheral circuits more easily. In addition, throughput in the fabrication process can be increased as a result. Moreover, photo sensing elements with the same degree of sensitivity can be gathered to form linear image sensors.

Hereinafter, the image sensor head according to the present invention is described as follows.

One embodiment of the present invention will be described in conjunction with the drawings.

Figure 9:
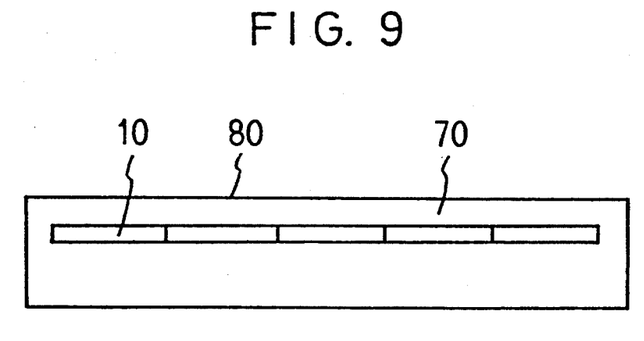
FIG. 9 is a plan view of the inventive image sensor head.

FIG. 9 is a plan view of the inventive image sensor head of the contact type.

The image sensor head 80 is comprised of a base plate 70 and a plurality of image sensors 10 mounted on the base plate 70 linearly with one another in a main scanning direction.

A plurality of image sensors 10 are arranged linearly on a base plate 70. Adjacent image sensors 10 are disposed closely with a gap of less than several tens of μm.

According to the present invention, there can be obtained an image sensor head of the contact type having uniform output performance with a simplified construction.

What is claimed is:

1. A method of inspecting image sensors formed on a surface of a semiconductor wafer comprising: cutting grooves at boundaries between image sensors formed on the surface of the semiconductor wafer, each groove having a depth being smaller than a thickness of the semiconductor wafer; and inspecting a photo electro conversion characteristic of a plurality of image sensors formed on the surface of the semiconductor wafer before cutting the semiconductor wafer into individual image sensors.

2. A method of manufacturing image sensors comprising:
cutting grooves at boundaries between image sensors formed on the surface of the semiconductor wafer, each groove having a depth being smaller than a thickness of the semiconductor wafer;
inspecting a photo electro conversion characteristic of a plurality of image sensors formed on the surface of the semiconductor wafer, before cutting the semiconductor wafer into individual image sensors; and
cutting the wafer for separating image sensors at boundaries between the image sensors formed on the surface of the semiconductor wafer.

3. A method of inspecting image sensors formed on a surface of a semiconductor wafer, comprising the steps of:
cutting grooves at boundaries between image sensors to be inspected and formed on the surface of the semiconductor wafer, each groove having a depth being smaller than a thickness of the semiconductor wafer so that photo sensing carriers not generated by an image sensor being inspected do not affect an inspection of the image sensor being inspected; and inspecting at least one characteristic of at least one of the image sensors formed on the surface of the semiconductor wafer before cutting through the semiconductor wafer to form individual image sensors.

4. A method of inspecting image sensors according to claim 3; wherein the step of cutting grooves comprises cutting grooves using one of a dicing saw, scraper, laser and plasma-etcher.

5. A method of inspecting image sensors according to claim 3; wherein the step of cutting grooves comprises cutting grooves to a depth of at least 10 microns.

6. A method of inspecting image sensors according to claim 3; wherein the step of inspecting comprises inspecting a photo electro conversion characteristic.

7. A method of inspecting image sensors according to claim 3; wherein the step of cutting grooves comprises cutting grooves having a distance between each groove and an adjacent image sensor of at least 5 microns.

8. A method of manufacturing image sensors, comprising the steps of: forming a plurality of image sensors on the surface of a semiconductor wafer; cutting grooves at boundaries between at least two image sensors to be inspected and formed on the surface of the semiconductor wafer, each groove having a depth being smaller than a thickness of the semiconductor wafer so that photo sensing carriers not generated by an image sensor being inspected do not affect an inspection of the image sensor being inspected; and then inspecting at least one characteristic of at least one of the image sensors formed on the surface of the semiconductor wafer before cutting through the semiconductor wafer to form individual image sensors.

9. A method of manufacturing image sensors according to claim 8; wherein the step of cutting grooves comprises cutting grooves using one of a dicing saw, scraper, laser and plasma-etcher.

10. A method of manufacturing image sensors according to claim 8; wherein the step of cutting grooves comprises cutting grooves to a depth of at least 10 microns.

11. A method of inspecting image sensors according to claim 8; wherein the step of inspecting comprises inspecting a photo electro conversion characteristic.

12. A method of inspecting image sensors according to claim 8; wherein the step of cutting grooves comprises cutting grooves having a distance between each groove and an adjacent image sensor of at least 5 microns.

* * * * *